US008830108B2

(12) United States Patent
Balle et al.

(10) Patent No.: US 8,830,108 B2
(45) Date of Patent: Sep. 9, 2014

(54) CIRCUIT ARRANGEMENT FOR DETECTING AND DIGITIZING AN ANALOG INPUT SIGNAL, AND FIELD DEVICE FOR PROCESS INSTRUMENTATION

(75) Inventors: Patrick Balle, Malsch (DE); Eric Chemisky, Soultz sous forets (FR)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/982,216

(22) PCT Filed: Jan. 25, 2012

(86) PCT No.: PCT/EP2012/051082
§ 371 (c)(1),
(2), (4) Date: Oct. 11, 2013

(87) PCT Pub. No.: WO2012/101144
PCT Pub. Date: Aug. 2, 2012

(65) Prior Publication Data
US 2014/0022104 A1  Jan. 23, 2014

(30) Foreign Application Priority Data
Jan. 28, 2011  (DE) .......................... 10 2011 003 306

(51) Int. Cl.
*H03M 1/60*  (2006.01)
(52) U.S. Cl.
USPC ............................ 341/157; 341/156; 341/155
(58) Field of Classification Search
CPC ........................................................ H03M 1/60
USPC ......................................... 341/155, 156, 157
See application file for complete search history.

(56) References Cited

U.S. PATENT DOCUMENTS

| 4,737,712 | A | * | 4/1988 | Stormont et al. ............. 324/307 |
| 4,850,698 | A | | 7/1989 | Kordts et al. |
| 6,181,099 | B1 | * | 1/2001 | Bixel et al. .................... 318/610 |
| 6,392,557 | B1 | * | 5/2002 | Kreuter ......................... 307/112 |
| 7,012,418 | B2 | | 3/2006 | Reischl et al. |
| 7,786,919 | B2 | | 8/2010 | Parfitt |
| 2003/0117751 | A1 | * | 6/2003 | Murabayashi et al. ........... 361/1 |
| 2005/0272378 | A1 | * | 12/2005 | Dupuis ...................... 455/67.15 |
| 2010/0254465 | A1 | | 10/2010 | Wohrle et al. |

FOREIGN PATENT DOCUMENTS

| DE | 3606488 | 9/1987 |
| DE | 3920648 | 1/1991 |
| DE | 10353295 | 6/2005 |
| DE | 102007060555 | 6/2009 |
| WO | WO 03019116 | 3/2003 |
| WO | WO 2009038650 | 3/2009 |

* cited by examiner

*Primary Examiner* — Jean B Jeanglaude
(74) *Attorney, Agent, or Firm* — Cozen O'Connor

(57) ABSTRACT

A circuit arrangement for detecting and digitizing an analog input signal and to a field device for process instrumentation, wherein the field device comprises such a circuit arrangement which includes a first electronics unit, a second electronics unit, and an interface by which the two electronics units are galvanically separated from each other. A first signal is generated at a first frequency in the second electronics unit. A voltage frequency converter, to which the analog input signal is routed, uses a reference frequency to generate a second signal at a second frequency that corresponds to the level of the analog input signal. After the second signal has been transmitted to the second electronics unit using an optical coupler, a ratiometric measurement of the second frequency is performed in the second electronics unit dependent on the first frequency using a capture timer.

7 Claims, 1 Drawing Sheet

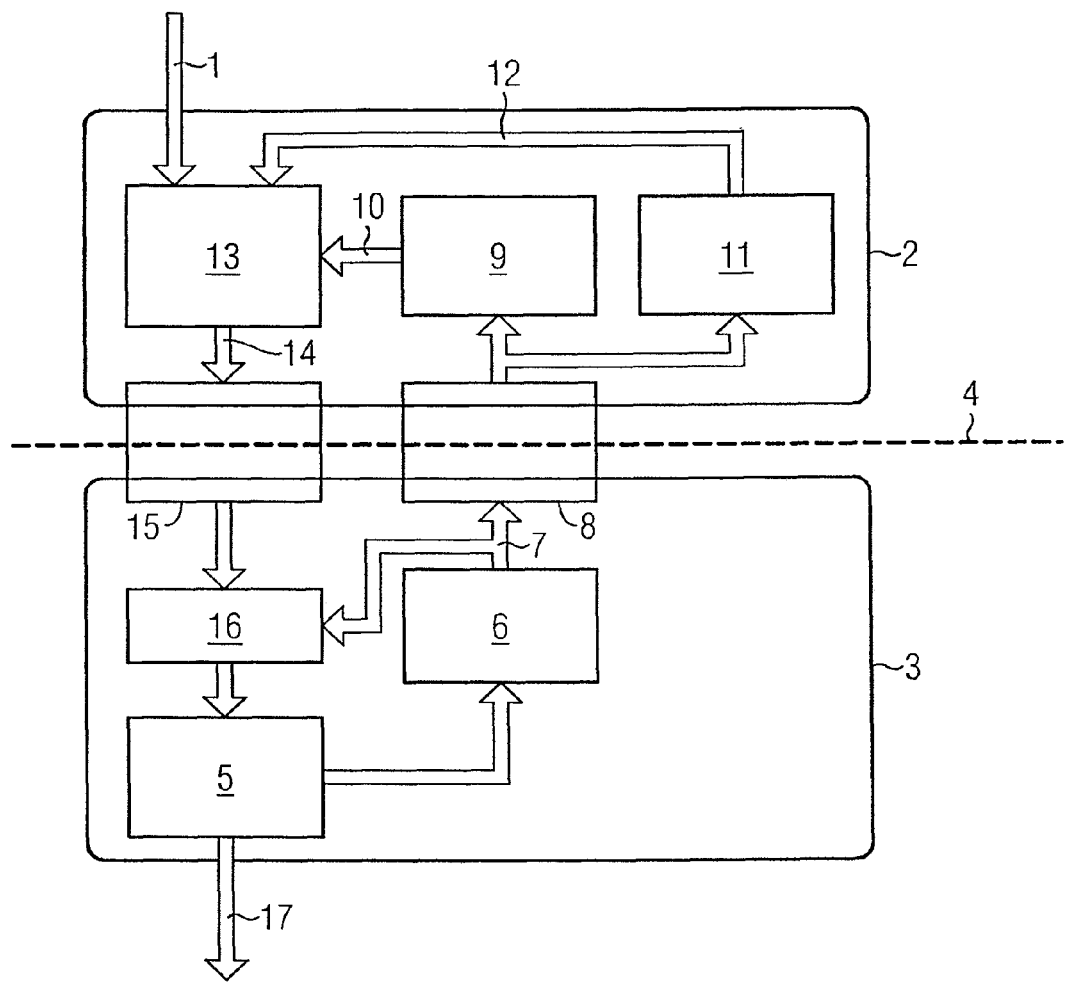

CIRCUIT ARRANGEMENT FOR DETECTING AND DIGITIZING AN ANALOG INPUT SIGNAL, AND FIELD DEVICE FOR PROCESS INSTRUMENTATION

CROSS-REFERENCE TO RELATED APPLICATIONS

This is a U.S. national stage of application No. PCT/EP2012/051082 filed 25 Jan. 2012. Priority is claimed on German Application No. 10 2011 003 306.8 filed 28 Jan. 2011, the content of which is incorporated herein by reference in its entirety.

BACKGROUND OF THE INVENTION

1. Field of the Invention

The invention relates to a circuit arrangement for detecting and digitizing an analog input signal having a first electronics unit to which the analog input signal is connected, having a second electronics unit for outputting a digital value representing the level of the analog input signal, and having an interface for galvanically separating the two electronics units. In addition, the invention relates to a field device for process instrumentation, where the field device includes such a circuit arrangement.

2. Description of the Related Art

Automation technology frequently employs field devices for process instrumentation, which are used, for example, for detecting and/or influencing process variables, and which are connected to each other via an automation network for exchanging data. Field devices that detect a physical or chemical quantity as a process variable are frequently referred to as transducers, because they convert the respective quantity into a measured value, which they output, for example, to a higher-order control station or as an actual value to a controller for further processing. Examples of such transducers are transducers for filling level, mass rate of flow, pressure, temperature, pH value or conductivity.

A field device for process instrumentation can be divided into a sensor that converts the physical or chemical quantity to be detected into an analog electrical input signal, a first electronics unit to which the analog input signal is connected, and a second electronics unit in which, for example, a characteristic curve calibration is performed and that is galvanically isolated from the first electronics unit by an interface.

After determining a digital value representing the level of the analog input signal, a measured value corresponding to it is output, for example, via a 4 to 20 mA interface with or without data communication according to the HART protocol or via another fieldbus, for example, PROFIBUS or PROFINET, for further processing within the automation system. If the auxiliary power required for operating the field device is provided via the communication interface of the second electronics unit, a portion of the auxiliary power must be routed via the interface for galvanic isolation, for example, with the aid of an isolation transformer or via capacitors, to the first electronics unit to supply the field device with power.

One problem when transmitting an analog input signal via a galvanically isolated interface is that a galvanically isolated transmission of an analog signal is always associated with a relatively high loss of accuracy. In order to circumvent this problem, it is possible, for example, to provide an analog/digital conversion in the first electronics unit with respect to a reference voltage, to convert the analog signal into digital form. The converted signal can then be routed to the second electronics unit in digital form via a serial interface of a microcontroller with the aid of an optocoupler or alternatively via a capacitive or inductive link. However, the use of such components would cause high power consumption in the first electronics unit and would likewise entail high component costs. There would also be the relatively high cost of developing suitable firmware for the microcontroller of the first electronics unit, on which high demands for reliability would be placed, because communication between the microcontroller in the first electronics unit and a microcontroller in the second electronics unit would always have to be maintained even if EMC disturbances occur. In addition, the firmware would have to ensure that current measured value data is always available.

SUMMARY OF THE INVENTION

It is an object of the present invention to provide a circuit arrangement for detecting and digitizing an analog input signal, as well as a field device for process instrumentation having such a circuit arrangement, through which arrangement the above-described disadvantages are avoided when using a galvanically isolated interface between two electronics units.

This and other objects and advantages are achieved in accordance with the invention by a circuit arrangement and a field device for process instrumentation by which the information contained in the analog input signal is advantageously transmitted via the interface for galvanic isolation in the form of a frequency and thus practically without loss of accuracy. It is furthermore advantageous that it is possible to omit a microcontroller in the first electronics unit and that the circuit arrangement can thus be implemented at relatively low cost. In addition, the manufacturing costs are favorably affected in that the accuracy of the frequency setting of the first signal in the second electronics unit has no influence on the accuracy of the transmission of the information contained in the analog input signal, because the frequency setting must be stable only for a short time over the period of time of the determination of the measured values.

To implement the device or components for producing the first signal of the first frequency, additional devices are advantageously not required in many cases, because a microcontroller having a timer, which is normally available in any case and which must merely be programmed accordingly, can be used for this purpose.

In an especially advantageous further embodiment of the invention, the device for the galvanically isolated transmission of the first signal includes a transformer, which is capable of transmitting both the auxiliary power required for operating the first electronics unit and the frequency information for the first signal simultaneously. To improve the transmission characteristics of the transformer, two push-pull signals of the same frequency are derived from the first signal, which are connected to the input side of the transformer. A second channel for transmitting operating power via the galvanically isolated interface is therefore advantageously not required, thus minimizing the cost of implementation.

In addition, an especially simple implementation of the first electronics unit is possible if a device for producing the second signal is implemented using a voltage-frequency converter in which a signal of the first frequency is used as a reference frequency for converting the analog input signal into a second frequency that corresponds to the voltage level of the analog input signal. The signal of the first frequency can be derived in the first electronics unit, for example, from the output signal of the transformer.

After transmitting the second signal of the second frequency to the second electronics unit, a ratiometric measurement of the second frequency, which contains the information about the level of the analog input signal, is performed there, preferably with the aid of a capture timer. Such a ratiometric measurement has the advantage that it is performed virtually automatically by the capture timer of a microcontroller in the second electronics unit and does not require any computing power from it. The measurement of the second frequency is made relative to the first frequency when performing the ratiometric measurement. As a result, additional calculations in the microcontroller are omitted and it is possible to enable a high level of measurement accuracy.

The use of the new circuit arrangement for detecting and digitizing an analog input signal in a field device for process instrumentation, where galvanic isolation must be provided in the field device between a process connection and an interface for communication within an automation network, is especially advantageous. If a reference voltage is required to produce the analog input signal with the aid of a sensor in the first electronics unit, this reference voltage can easily be produced from the output signal of the transformer that is used for the galvanically isolated transmission of the first signal. If the sensor is used to perform a ratiometric measurement for the physical or chemical quantity as a process variable, such as when using a temperature sensor using a PT100, in which the variable resistance of the sensor element is compared to a reference resistance or, such as when using a resistive pressure sensor, an exact reference voltage is then not required in the first electronics unit. In this case, the field device performs a ratiometric measurement twice: once in the analog range of the sensor, and a second time when evaluating the frequency of the second signal that is transmitted via the galvanically isolated interface. This has an especially advantageous effect on the accuracy achieved using the field device and on the associated cost.

In accordance with the invention, only digital signals must be conducted via the galvanically isolated interface. As a result, the cost for analog galvanic isolation between the two electronics units is advantageously omitted. With regard to the manufacturing cost, it is also advantageous that it is possible to dispense with a costly digital/analog converter, because the conversion is performed with the aid of the voltage-frequency converter and the ratiometric frequency measurement. In addition, the implementation is characterized by especially low demands on the computing power of a microcontroller.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention, as well as arrangements and advantages, are described in detail below using the drawing depicting an embodiment of the invention in which:

The FIGURE is a schematic block diagram of the circuit arrangement in accordance with the invention.

DETAILED DESCRIPTION OF THE PREFERRED EMBODIMENTS

The FIGURE serves to explain the essential parts of the invention of a circuit arrangement that is used in a field device for process instrumentation for detecting an analog input signal 1 and for determining a digital value 17 corresponding to this signal. Here, only a first electronics unit 2 and a second electronics unit 3, which are galvanically isolated via an interface 4, are depicted. Other parts of the field device, which can be implemented in a conventional manner, are not depicted in the drawing for the sake of clarity.

A microcontroller 5, which is part of the second electronics unit 3, produces a first signal 7 at a first frequency f1 with the aid of a timer 6 which, alternatively to the illustrated embodiment, can be integrated into the microcontroller 5. To transmit the first signal 7 via the galvanically isolated interface 4, two push-pull signals are derived from the signal 7, which are connected to the input of a transformer 8. On the output side, the transformer 8 in the first electronics unit 2 is connected to a device 9, which supplies the auxiliary power required for operating the first electronics unit 2 and a signal 10, whose frequency is identical to the first frequency f1, but which is at least in a fixed proportion to this frequency. Both the required auxiliary power and the frequency information about the first frequency f1 are thus supplied to the first electronics unit 2 via the same transformer 8. A reference voltage source 11 can optionally be provided in the first electronics unit 2, which produces a highly accurate reference voltage 12 from the output signal of the transformer 8. Such a reference voltage may be useful if, as already described above, no ratiometric measurement is performed in a sensor from which the analog input signal 1 is supplied.

The analog input signal 1 is supplied to a voltage-frequency converter 13, which uses the signal 10 having the first frequency as a reference frequency. The voltage-frequency converter 13 supplies a second signal 14, which has a second frequency f2. The ratio of the second frequency f2 to the first frequency f1 of the signal 10 corresponds to the level of the analog input signal 1. The signal 14 is transferred to the second electronics unit 3 with the aid of an optocoupler 15 or another galvanically isolated transmission device. The output signal of the optocoupler 15 having the second frequency f2 and the first signal 7 having the first frequency f1 are provided together to a capture timer 16, which performs a ratiometric measurement of the second frequency f2. The second frequency f2 is thus determined as a function of the first frequency f1, so that the clock of the microcontroller 5, from which the first signal 7 can be derived, has no effect on the accuracy of measurement. The function of the capture timer 16 can be integrated into the microcontroller 5.

As illustrated in the described embodiment, the invention has substantial advantages, which are once again briefly summarized below simultaneous transmission of the operating power for the first electronics unit 2 and the first signal 7 having the first frequency as a reference frequency via a transformer 8, determination of a digital value 17 that corresponds to the level of the analog input signal 1, without using the computing power of the microcontroller 5 by using a voltage-frequency converter 13 and timers for frequency measurement, independence of the measurement result from a potentially inaccurate microcontroller 5 clock in the second electronics unit 3, in the case of ratiometric production of the analog input signal 1, a savings is made on a highly accurate reference voltage source 11 in the first electronics unit 2, a comparatively power-saving measurement of the analog input signal 1 across a galvanically isolated interface 4 is provided, and the circuit arrangement is also highly suitable for low-power applications, because the entire electronics unit 2 can be very easily and quickly and switched off and switched on again.

In addition, no microcontroller is used on the electronics side 2. As a result, there are also no longer start-up periods with initialization or transient phases of the quartz, and the circuitry in the electronics unit 2 starts automatically as soon as the transformer 8 supplies enough voltage to its secondary side. The voltage-frequency conversion thus begins immediately, so that the microcontroller 5 of the electronics unit 3 can begin the clock counting immediately after it starts up, in order to perform frequency measurement via its capture timer 16.

Thus, while there have shown, described, and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A circuit arrangement for detecting and digitizing an analog input signal comprising:
    a first electronics unit to which the analog input signal is connected; and
    a second electronics unit for outputting a digital value representing a level of the analog input signal, the second electronics unit including means for producing a first signal of at a first frequency;
    an interface galvanically isolating the first electronics unit and the second electronics unit from each other, the interface comprising means for galvanically isolated transmission of the first signal to the first electronics unit and means for galvanically isolated transmission of the second signal to the second electronics unit;
    wherein the first electronics unit includes with means for producing a second signal of at a second frequency as a function of the level of the analog input signal and the first frequency; and
    wherein the second electronics unit further includes means for determining a digital value as a function of the first and second frequencies.

2. The circuit arrangement as claimed in claim 1, wherein the means for producing the first signal comprises a microcontroller and a timer.

3. The circuit arrangement as claimed in claim 2, wherein the means for galvanically isolated transmission of the first signal includes a transformer for transmitting power, two push-pull signals derived from the first signal being connected to the transformer.

4. The circuit arrangement as claimed in claim 2, wherein the means for producing the second signal comprise a voltage-frequency converter to which a signal of the first frequency is connected as a reference frequency.

5. The circuit arrangement as claimed in claim 3, wherein the means for producing the second signal comprise a voltage-frequency converter to which a signal of the first frequency is connected as a reference frequency.

6. The circuit arrangement as claimed in claim 2, wherein the means for determining the digital value comprise a capture timer to which the first signal at the first frequency and the second signal at the second frequency are connected.

7. A field device for process instrumentation comprising the circuit arrangement as claimed in claim 1.

* * * * *